United States Patent [19]

Wisner

[11] Patent Number: 5,270,595
[45] Date of Patent: Dec. 14, 1993

[54] DYNAMIC THERMAL COMPENSATION FOR A MAGNETOSTRICTIVE ACTUATOR

[75] Inventor: George R. Wisner, Deep River, Conn.

[73] Assignee: United Technologies Corporation, Hartford, Conn.

[21] Appl. No.: 657,094

[22] Filed: Oct. 2, 1984

[51] Int. Cl.5 .......................................... H01L 41/06
[52] U.S. Cl. ........................................ 310/26; 318/118; 310/12
[58] Field of Search .................................. 310/12-14, 310/26; 318/116, 118

[56] References Cited

U.S. PATENT DOCUMENTS

| | | | |
|---|---|---|---|
| 3,217,543 | 11/1965 | Haagen | 310/26 X |
| 3,389,274 | 6/1968 | Robertson | 310/26 X |
| 3,419,739 | 12/1968 | Clements | 310/26 X |
| 3,429,155 | 2/1969 | Hines | 310/26 X |
| 3,889,166 | 6/1975 | Scurlock | 310/26 X |
| 4,104,549 | 8/1978 | Akimoto et al. | 310/26 |
| 4,129,851 | 12/1978 | Podgorski | 310/26 X |

Primary Examiner—Mark O. Budd

[57] ABSTRACT

A magnetostrictive linear actuator, responsive to an external signal, including a housing assembly that encloses a magnetostrictive force train assembly, an excitation means disposed on a component of one assembly, as well as a thermal compensation means disposed on a component of the complementary assembly, and a controller means responsive to the external signal which provides a heat control signal in dependence on the magnitude of the controller signal such that the thermal expansion of the assembly heated by the excitation means will be compensated by a matching thermal expansion induced in the complementary assembly.

10 Claims, 4 Drawing Sheets

DYNAMIC THERMAL COMPENSATION FOR A MAGNETOSTRICTIVE ACTUATOR

TECHNICAL FIELD

This invention relates to linear stroke actuators and more particularly to linear stroke actuators employing magnetostrictive action.

BACKGROUND ART

Magnetostrictive linear actuators are well known in the art; finding extensive use in sonar applications, and more recently with deformable mirrors used in an advanced High Energy Laser (HEL) system. These devices rely on the unique properties of certain materials whose dimensions can change as a function of an applied magnetic field. To produce the desired linear movement a rod of magnetostrictive material is placed in a solenoid configuration. When current is passed through the coil, a change in the length of the magnetostrictive rod can be observed. This change in length is proportional to the magnitude of the applied field. With the newer magnetostrictive materials such as terfenol ($Tb_{0.27}Dy_{0.73}Fe_{1.95}$) or an iron cobalt metallic glass such as METGLASS® 2605Co ($Fe_{0.67}Co_{0.18}B_{0.14}Si_{0.01}$), large displacements on the order of several tens of microns can be produced. Overall performance of these actuators is comparable to currently available piezoceramic actuators, when bandwidth and hysteresis characteristics as well as displacement accuracy are considered.

These magnetostrictive actuators have several advantages over their piezoceramic counterparts, the most prominent of which is the low voltage required for operation. For airborne application, weight and power losses of high voltage, direct current power supplies required for piezoelectric actuators also impose practical constraints on system design. In addition, magnetostrictive actuators display negligible displacement drift or "creep" along the extension axis, unlike piezoceramic actuators which commonly exhibit around 5% displacement drift.

Unfortunately, magnetostrictive actuators require relatively large amounts of power either to bias the actuator at a quiescent operating point or for initialization. Consequently, they are burdened by their inherent power dissipation requirements. Depending upon the configuration, this results in an excessive amount of heat being generated near, and conducted into, the magnetostrictive rod assembly or the actuator casing. A local increase in temperature of the rod or case produces a corresponding thermal expansion in that component. The increase in length is in addition to the magnetostrictively induced change in the rod's length. The magnitude of the thermally induced change is quite significant and can substantially exceed the change in length induced magnetostrictively.

Earlier devices utilizing the magnetostrictive effect were optimized for short duty cycle AC performance. Thermal expansion of the actuator assembly was present but, not of concern. However, linear actuators of the present type require precision and stability of absolute displacement, making any uncontrolled change in length due to heating unacceptable. To date, efforts to correct for this thermal expansion have centered on passive designs to improve the cooling of the actuator assemblies themselves. However the compact nature of the electric coil and magnetostrictive rod assembly mandate inherently poor heat transfer characteristics. Moreover, their use in deformable mirror applications compound this problem, since the actuator must be located in a densely packed array.

DISCLOSURE OF INVENTION

The object of the present invention is to provide a linear magnetostrictive actuator wherein displacement accuracy is maintained despite differential thermal expansion of its constituent assemblies.

According to the present invention, a magnetostrictive actuator whose displacement depends on the magnitude of an external signal, comprises a linear displacement generator characterized by two component assemblies, a force train assembly which is adapted for connection to a load with at least one magnetostrictive element, and a housing assembly which encloses the force train assembly within it. In addition, the actuator has a controller means responsive to the external signal which provides a heat control signal in dependence on the magnitude of the controller signal. Moreover, the magnetostrictive actuator of the present invention contains an excitation means disposed alternatively on a component of either one of the two assemblies and a heating means disposed on the other of the two assemblies such that the thermal expansion of that assembly of the actuator directly heated as a consequence of the operation of the excitation means is compensated by actively dispensing heat into either an element of the force train assembly or housing assembly, whichever has not been heated by the excitation means, so that the total change in displacement of the actuator resulting from the sum of these thermal expansions is zero.

According to another aspect of the invention, the control signal for the heating means is provided by a control means that has a signal processing means which provides for periodic sampling of the external signal, storing of that signal in a memory means, comparing each of the sampled external signal magnitudes with reference values stored within a memory means that are associated with a specific magnetic field intensity and which correspond to one of a plurality of values of the heat control signal.

According to yet another aspect of the present invention, the magnetostrictive extension and retraction of the force train assembly is performed about a reference displacement bias point provided by a bias magnetic field means.

These and other objects, features and advantages of the present invention will become more apparent in light of the following detailed description of a best mode embodiment thereof, as illustrated in the accompanying drawing.

BRIEF DESCRIPTION OF DRAWINGS

FIG. 3 is an illustration of a distinctive property of magnetostrictive materials used in the present invention;

BEST MODE FOR CARRYING OUT THE INVENTION

Figure 2:
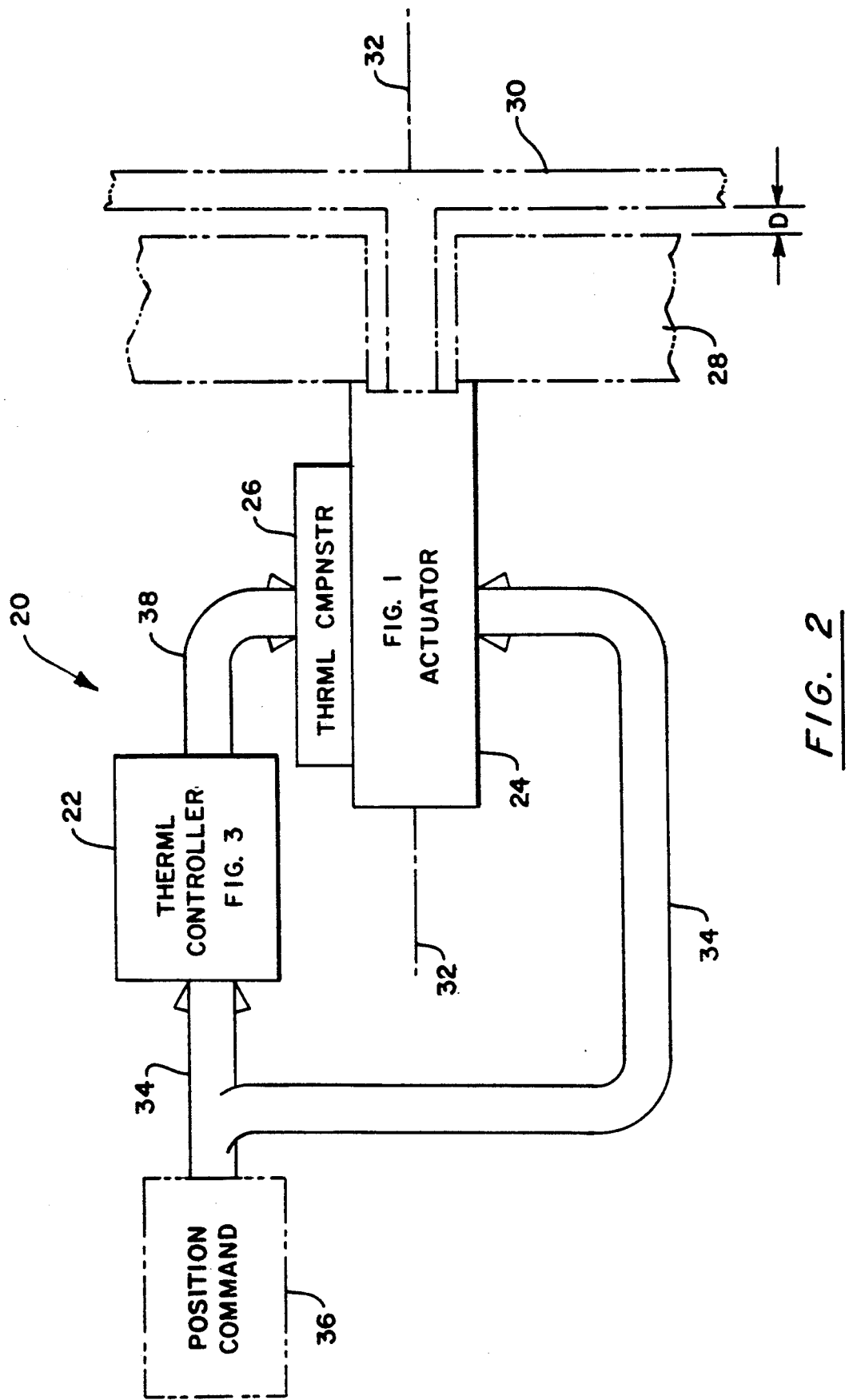
FIG. 2 is a simplified system block diagram of the compensated magnetostrictive actuator configuration of the present invention.

Referring first to FIG. 2, in a simplified block diagram of the compensated magnetostrictive actuator configuration of the present invention, the compensated magnetostrictive actuator configuration 20 includes a thermal controller 22, an actuator 24 and a thermal compensator 26. The actuator is connected to an actuator mount 28 and to a load device 30, such that the load is in register with the actuator displacement axis 36. The actuator and the thermal controller each receive an electrical position signal on lines 34 from position command circuitry 36; the position command circuitry being part of the parent control system in which the compensated magnetostrictive actuator configuration may be used, and not part of the present invention. The actuator responds to the position signal magnitude by producing a displacement (D) along axis 32, either extraction or retraction. As a result, load 30 is moved linearly along axis 32 relative to actuator mount 28.

As described hereinafter with respect to FIG. 1, the actuator 24 includes two major assemblies: a force train assembly which includes the magnetostrictive element, and the actuator housing assembly which encloses the force train. The position signal electrical power is dissipated in the force train assembly, causing thermal expansion of the force train within the housing assembly and producing a positional error in the displacement of load 30. This displacement error is anticipated by thermal controller 22 which, in response, issues a command signal on lines 38 to the thermal compensator to provide supplemental heat to the actuator housing assemblies. As a result the housing expands with the force train so as to substantially reduce the positional error.

Figure 1:
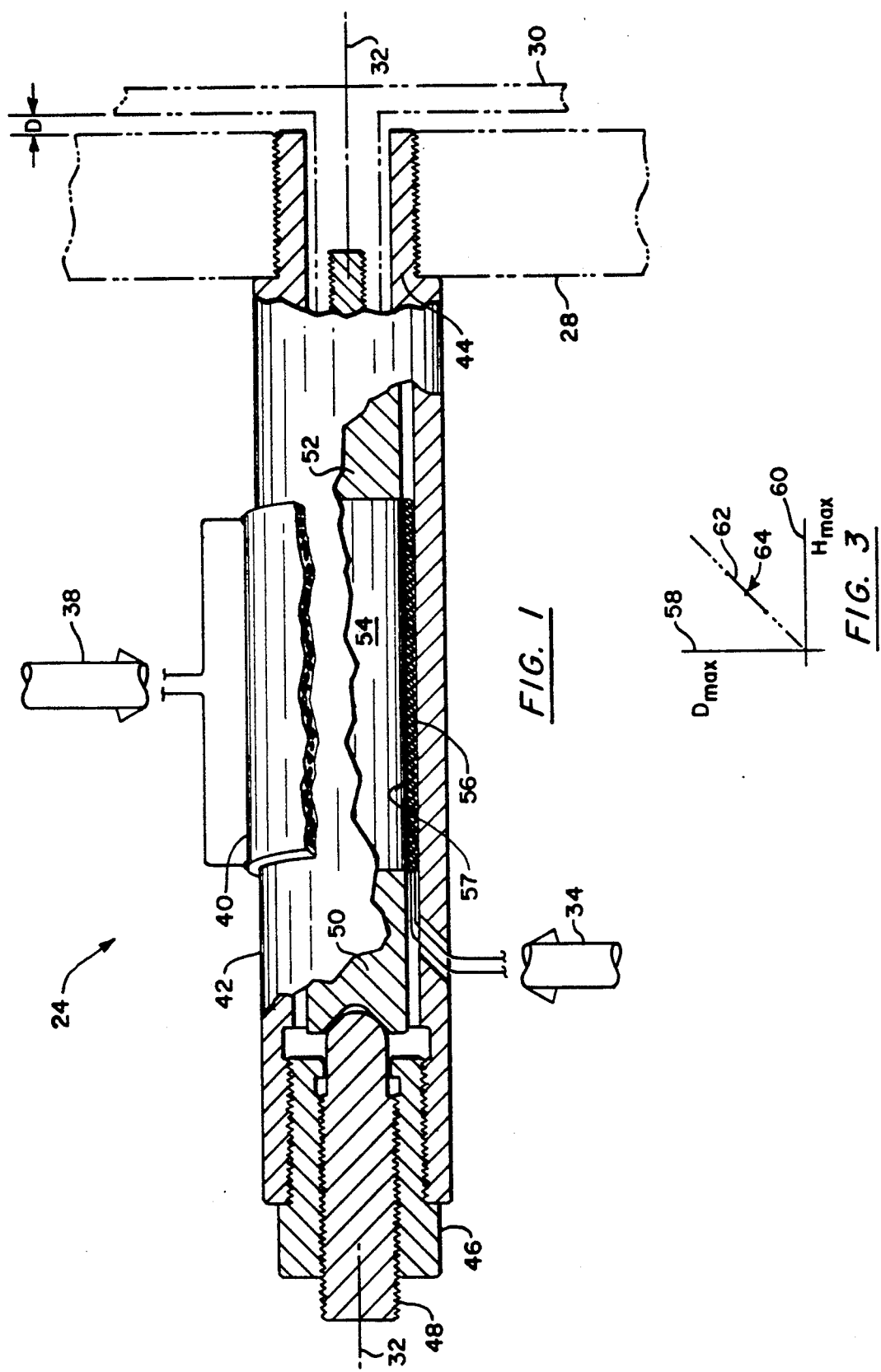
FIG. 1 is an illustration partially in perspective and partially in section of a best mode embodiment of a compensated magnetostrictive actuator for use in the present invention.

FIG. 1 shows a view, partially in section and partially in perspective, of the compensated actuator for use in the present invention. The actuator includes the force train and housing constituent assemblies, and a compensating heating means 40 located exterior to the actuator in the best mode embodiment. The housing assembly includes a cylindrical casing 42, a connector 44, an outer threaded coarse adjustment ring 46, and an inner threaded fine adjustment bolt 48. The force train assembly, contained within the housing assembly, includes permanent magnets 50 and 52, magnetostrictive rod 54, and a coupling means, not shown, which connects the force train to the load. Although the heating element is shown in proximity to the magnetostrictive element, it may be placed anywhere on the actuator casing.

The actuator casing 42 is a hollow metallic cylinder to which connector 44 is fastened by welding or other means. This assemblage is threaded into actuator mount 28. The connector is annular, with a center opening coaxial with axis 32. The load is inserted through the center opening of the connector where it contacts the force train assembly. Magnetostrictive rod 54 is connected on either end to permanent magnets 50 and 52 through suitable techniques known in the art. The complete force train assembly lies along the actuator displacement axis 32.

In the best mode embodiment an electrical coil 56, which produces the magnetic field in the magnetostrictive rod in response to the current component of the position signal, is wound on a sleeve 57 which surrounds the rod, within the casing. The inner diameter of the electrical coil and the outer diameter of the rod are essentially equal, such that the two are substantially in thermal contact. Electrical leads for the coil exit the casing through an appropriate opening located on the side of the casing. The other end of the force train is located by the fine adjustment bolt 48 and coarse adjustment ring 46, which are threaded together into casing 42.

In the best mode embodiment, the magnetostrictive rod is composed of terfenol or METGLASO ®, an iron cobalt amorphous glass. As is well known, these materials experience a stress when placed in an applied magnetic field. In the case of the rod 54, fixed at one end by adjustment bolt 48, the concomitant strain produces a change in length which displays the load end of the rod. The displacement (D) is expressed as $$D = HKl_c$$

where H is the magnetizing field strength, K is the stress (or strain) gain constant, and $l_c$ is the quiescent length of the rod.

The magnetostrictive material displacement D with applied magnetic field H is shown in FIG. 3. The axes 58, 60 correspond to displacement and magnetic field strength respectively. Curve 62 illustrates a relevant position of the displacement versus applied magnetic field relationship. Since all values of the applied field produce positive displacement, the material must be biased by an applied magnetic field in order to display both extension and contraction. Bias point 64 represents the quiescent value about which the actuator is operated. The magnetic field of the coil 56 produces the desired displacement about this bias point. In the FIG. 1 embodiment, the permanent magnets 50 and 52 provide the requisite bias magnetic field.

Referring again to FIG. 1, in operation an applied position command signal on lines 34 provides current flow through coil 56. The resulting supplemental magnetic field causes displacement of the magnetostrictive rod, either extension or contraction, in dependence on the field polarity. Since the force train assembly is fixed at one end by locating bolt 48, any extension or contraction therein will result in displacement of the load relative to the actuator mount.

In the prior art, magnetostrictive actuator displacement can be expressed as:

$$D_0 = D_{ms} + D_{te}$$

where $D_0$ is the actual displacement of the load, $D_{ms}$ is the displacement due to the magnetostrictive effect, and $D_{te}$ is the displacement due to thermal expansion of the force train assembly in response to internal temperature rise associated with the position signal power dissipation in the coil.

The compensated magnetostrictive actuator of the present invention corrects for the thermal expansion error $D_{te}$ by introducing a compensating thermal expansion in the actuator's complementary housing assembly. That is:

$$D_0 = D_{ms} + D_{te} - D_C$$

such that $$D_{te} = D_c$$

and finally $$D_0 = D_{ms}$$

where $D_c$ is the thermal expansion of the housing assembly induced by heater 40. Note that the sign of this term is opposite the sign of $D_{te}$.

Compensation for this thermal expansion is supplied by energizing a heating element 40. The heating element may be of a type known in the art. An example is a Nichrome type thin resistive heater with approximately 15 W maximum average power, such as the SERROCIN® spiral wrap heater. In the best mode embodiment, the heating element is wound on the exterior of the casing. The heat is conducted into casing 42, and the concomitant expansion of the casing results in displacement of the load relative to the actuator mount in a direction opposite to that resulting from thermal expansion of the force train assembly. This is the point of departure of the present invention over magnetostrictive actuators of the prior art.

The actual displacement $D_0$ of the load is a function of several variables:

$$D_0(P,t,H) = D_{ms}(H) + D_{te}(P,t) - D_c(P,t)$$

where P is the power dissipated in the coil, t is time, and H is the applied magnetic field.

The power dissipated in an electrical coil is itself a function of magpptic field, and is given by:

$$P = 4 \rho l_s H^2 \cdot \frac{(d_o + d_i)}{(d_o - d_i)},$$

for circular section coil wire; where $l_s$ is the length of the coil's winding, $\rho$ is the resistivity of the wire, H is the magnetizing field, $d_o$ is the outer diameter of the winding, and $d_i$ is the inner diameter of the winding. The relationship of position signal current I to applied magnetic field H is H=NI, where N is the number of turns in the coil, and magnetostrictively induced displacement $D_{ms}$ to applied field H is $$D_{ms} = HKl_c,$$

where K, and $l_c$ are described hereinbefore.

From the above equations it is possible to analytically relate the position signal current I to the magnetostrictive displacement $D_{ms}$ and to calculate the power dissipated in the coil as a function of current. Note that the thermal expansion of the force train is a function of both time and power.

The temperature rise T of the magnetostrictive rod associated with the power dissipated in the coil is obtained from the equation giving the time rate of change in temperature as $$\Delta T / \Delta t = P / KV$$

where P is the power, K is the specific heat of the core material, and V is the volume of the magnetostrictive rod.

A magnetostrictive displacement of 1.25 microns in a terfenol actuator results in a power dissipation of approximately 0.47 watts. In the best mode embodiment this results in an approximate 6° C. rise in temperature of the rod. The resultant thermal expansion is approximately 3.4 microns, from the expression $$\Delta L / L = \alpha \Delta T,$$

where $\alpha$ is coefficient of linear expansion.

In the best mode embodiment, the actual relationship between the magnetostrictive displacement and corresponding thermal expansion is best determined empirically. For a given actuator assembly each increment of magnetostrictive displacement produces an associated steady state thermal expansion of the force train. Empirical measurements of magnetostrictive displacements and corresponding thermal expansions are compiled. The equations hereinbefore described determine the corresponding coil current and position signal voltage magnitude needed for each displacement value, and a compilation of these calculated values is also generated. A table is prepared to correlate the coil's calculated current and voltage values with its related, measured magnetic field, magnetostrictive displacement, and thermal expansion values.

The relationship between the actual dimensional changes in the housing assembly due to thermal expansion (i.e. $D_c$) and the values of heater element current necessary to produce this change can also be empirically measured and tabulated. Since ideally the values of the force train and position assembly's thermal expansion are equal in magnitude ($D_{te} = D_c$), the two tabulations are combined into a master table which relates a specific position signal voltage (i.e. coil current and coil impedance) to a corresponding output signal to the compensating heater.

Figure 4:
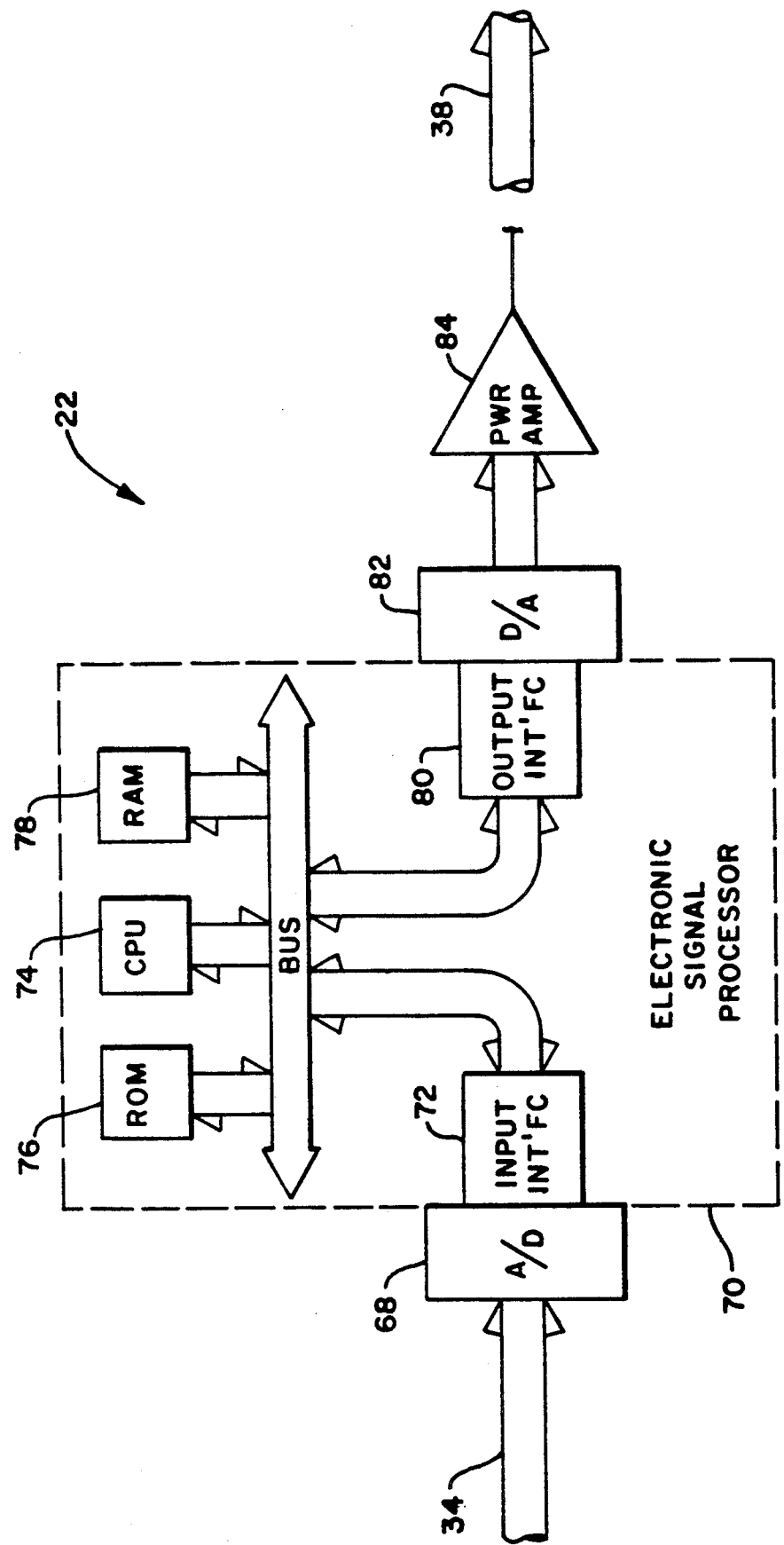
FIG. 4 is a detailed block diagram of one element of the system diagram of FIG. 2, for use with the best mode embodiment of FIG. 1.

FIG. 4 is a block diagram of thermal controller 22. In a best mode embodiment the controller is digital, however, as known to those skilled in the art equivalent performance may be obtained by a corresponding analog configuration.

When a position command signal is input to the compensating magnetostrictive actuator configuration (20 in FIG. 2), analog to digital converter 68 digitizes the voltage on lines 34 and passes the value to electronic signal processor 70.

The signal processor input interface 72 buffers the data for processing via central processing unit 74. The hereinbefore described master table compilation relating position signal voltage on lines 34 to the compensating heater signal is stored in a read only memory (ROM) 76. The central processing unit compares the digitized input voltage with entries in the master table and selects the corresponding heater signal value. Random access memory 78 is accessed by the central processor unit when necessary during this process. The signal exits via output interface 80 and is converted to an analog signal by digital to analog converter 82. This signal is an input voltage to power amplifier 84, which converts the voltage signal magnitude to a corresponding heater current signal magnitude on lines 38 to heater element 40 (FIG. 1). This process is continuous. The position signal voltage magnitude on lines 34 is continuously sampled by controller 22, and the value of the heater current signal is modulated accordingly.

Figure 5:
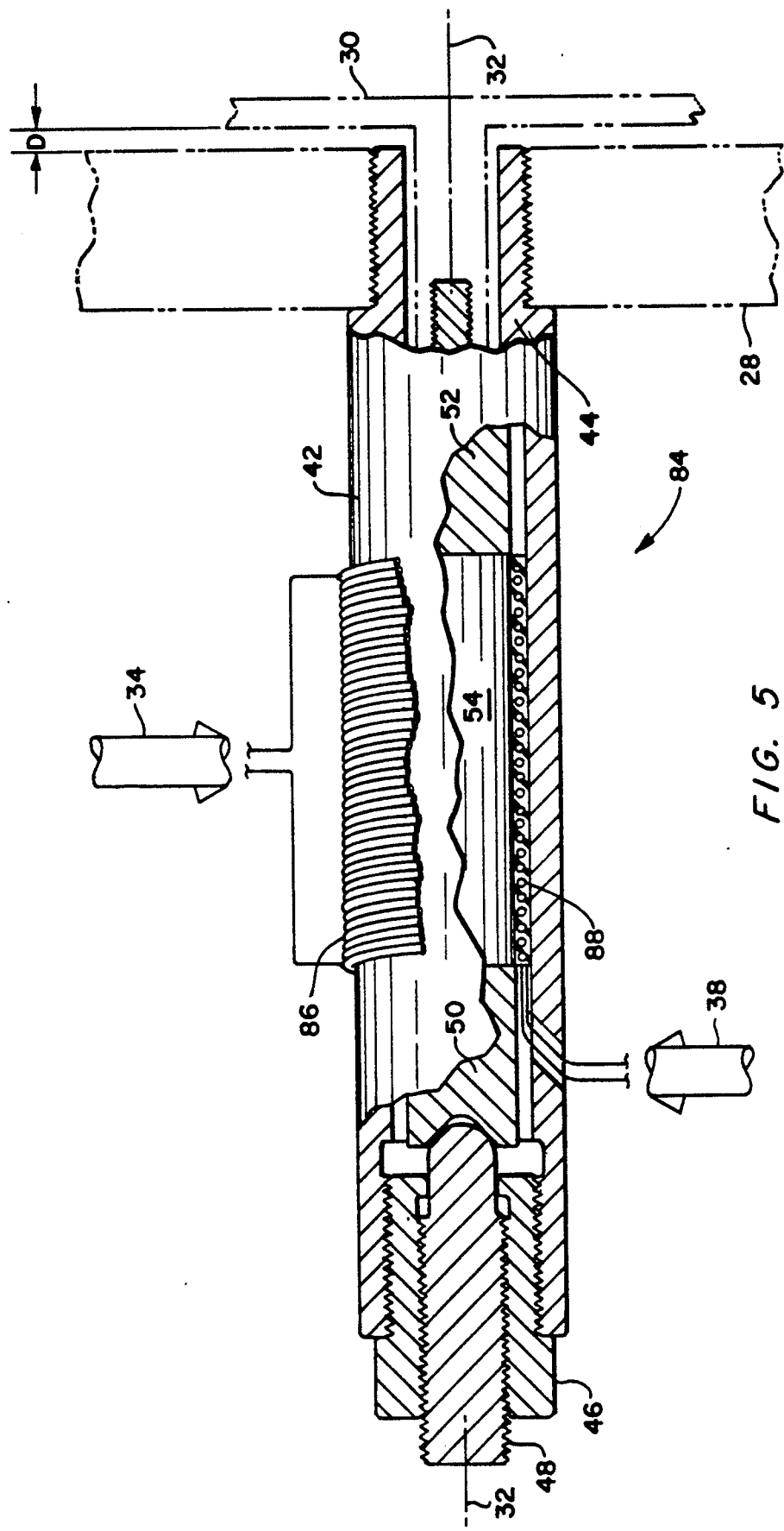
FIG. 5 is an illustration, partially in section and partially in perspective, of an alternative embodiment of the compensated magnetostrictive actuator of FIG. 1.

FIG. 5 illustrates an alternative actuator embodiment to that of FIG. 1. In the alternative embodiment the actuator 84 has a solenoid coil 86 mounted external of the casing 42, but coaxial with the magnetostrictive rod. Heating element 88 is disposed inside the casing, disposed around the magnetostrictive rod so as to be in thermal contact with it. The remaining components and structure of the compensated magnetostrictive actuator of the present invention remain unchanged from FIG. 1.

The power dissipated in the coil 86 is now deposited in the actuator casing of the housing assembly. Consequently, the compensating thermal expansion must now be produced in its complement, the force train assembly, requiring the heating element to be located as shown. As the source of the thermal error is no longer the force train assembly but rather the housing assembly, a new, but similar empirical/calculated compilation of values are stored in the electronic signal processor ROM, which reflect the change in assembly to which heat is applied, and the heating values needed for the compensating thermal expansion.

The thermal controller is illustrated in FIG. 2 as a separate system element. This is provided to facilitate a clear teaching of the controlled function. However, it should be understood that the physical elements of the controller may be located on the actuator assembly itself for single actuator embodiments, or as part of a supervisory control system for regulating operation of an array of actuators in a deformable mirror application.

Similarly, although the invention has been shown and described with respect to a best mode embodiment thereof, it should be understood by those skilled in the art that various other changes, omissions and additions thereto may be made therein without departing from the spirit and scope of the invention.

I claim:

1. A magnetostrictive actuator which provides linear displacement of a load along a displacement axis in dependence on the magnitude of an external signal, comprising:
   a force train assembly adapted for connection to the load and having at least one magnetostrictive element for providing displacement of the load along the displacement axis in response to the magnitude of a magnetic field applied thereto;
   a housing assembly for enclosing said force train assembly;
   excitation means disposed on said force train assembly and said housing assembly, alternatively, for providing said magnetic field at a magnitude in dependence on the magnitude of the external signal;
   heating means disposed on the alternate one of said force train assembly and said housing assembly from which said excitation means is disposed, for heating said alternate assembly in dependence on the magnitude of a heat control signal presented thereto;
   controller means responsive to the external signal for providing in dependence on the magnitude thereof, said heat control signal to said heating means, whereby said alternate assembly is heated in dependence on the magnitude of said magnetic field.

2. The magnetostrictive actuator of claim 1, wherein said excitation means comprises at least one electrical coil means responsive to the magnitude of a current component of the external signal for providing said magnetic field at a magnitude in dependence on the magnitude of said current component.

3. The magnetostrictive actuator of claim 1, wherein:
   the linear displacement of the actuator includes extension and retraction of the force train assembly about a reference displacement bias point, and wherein:
   said force train further includes at least one permanent magnet disposed in series with said magnetostrictive element for providing therethrough a bias magnetic field for positioning the actuator at said bias point in a quiescent state, whereby said excitation means provides said magnetic field in a modulating manner to provide the actuator extension and retraction.

4. The magnetostrictive actuator of claim 1, wherein said heating means comprises a resistance heating element.

5. The magnetostrictive actuator of claim 4, wherein said resistance heating element comprises a Nichrome wire spiral wrap.

6. The magnetostrictive actuator of claim 1, wherein said magnetostrictive element comprises a cylindrical rod of terfenol.

7. The magnetostrictive actuator of claim 1, wherein said magnetostrictive element comprises a cylindrical rod of iron cobalt amorphous metallic glass.

8. The magnetostrictive actuator of claim 1, wherein said controller means comprises:
   signal processing means, having memory means for storing signals, including reference signals indicative of a plurality of magnetic field intensity values, each corresponding to an associated external signal magnitude, and each further corresponding to an associated one of a plurality of magnitudes of said heat control signal, said processing means provides for:
   periodic sampling of the external signal magnitude storing sampled values in said memory means,
   identifying each of said sampled signal magnitudes with the related one of said plurality of external signal magnitude stored in said memory, and
   providing for each sample the corresponding one of said plurality of signal magnitudes of said heat control signal.

9. The magnetostrictive actuator of claim 2, wherein said electrical coil means is disposed on said magnetostrictive element, for providing said magnetic field therein, and said heating means is disposed on said housing assembly.

10. The magnetostrictive actuator of claim 2, wherein said electrical coil means is disposed on said housing and said heating means is disposed on said force train assembly.

* * * * *